United States Patent
Wang et al.

(10) Patent No.: US 8,031,344 B2
(45) Date of Patent: Oct. 4, 2011

(54) Z-STAGE CONFIGURATION AND APPLICATION THEREOF

(75) Inventors: You-Jin Wang, Milpitas, CA (US); Chung-Shih Pan, Palo Alto, CA (US)

(73) Assignee: Hermes Microvision, Inc., Hsinchu (TW)

( * ) Notice: Subject to any disclaimer, the term of this patent is extended or adjusted under 35 U.S.C. 154(b) by 179 days.

(21) Appl. No.: 12/609,262

(22) Filed: Oct. 30, 2009

(65) Prior Publication Data

US 2011/0101222 A1    May 5, 2011

(51) Int. Cl.
*G01B 11/02* (2006.01)
*G01J 1/00* (2006.01)

(52) U.S. Cl. ........ 356/498; 356/482; 356/493; 356/399; 356/28.5; 218/121.6; 218/121.74; 700/280

(58) Field of Classification Search ................. 356/4.01, 356/28.5, 399–401, 482, 486, 493, 498, 614, 356/615, 900; 219/121.6, 121.74; 250/491.1; 700/280
See application file for complete search history.

(56) References Cited

U.S. PATENT DOCUMENTS

| | | | |
|---|---|---|---|
| 6,229,934 B1 * | 5/2001 | Melman et al. | 385/18 |
| 6,271,923 B1 * | 8/2001 | Hill | 356/487 |
| 6,392,741 B1 * | 5/2002 | Mori et al. | 355/53 |
| 6,512,588 B1 * | 1/2003 | Hill | 356/510 |
| 6,806,960 B2 * | 10/2004 | Bagwell et al. | 356/487 |
| 6,888,639 B2 * | 5/2005 | Goebel et al. | 356/504 |
| 2003/0197870 A1 * | 10/2003 | Bagwell et al. | 356/493 |
| 2005/0133485 A1 * | 6/2005 | Tokura | 219/121.6 |
| 2009/0095086 A1 * | 4/2009 | Kessler et al. | 73/606 |
| 2010/0014097 A1 * | 1/2010 | Sogard | 356/498 |

* cited by examiner

*Primary Examiner* — Bernard E Souw
(74) *Attorney, Agent, or Firm* — Rosenberg, Klein & Lee

(57) ABSTRACT

A stage configuration is provided, wherein a ceramic plate is used as the z-stage body to decrease the use of the metal plates in the conventional configuration, so that the compact structure of the z-stage may decrease the vibrational movements of the z-stage. Further, two Laser interferometer are used to detect a movement of different points along a vertical line of the z-stage sidewall to calculate a movement of the specimen surface, so that a horizontal movement of the specimen surface can be detected more accurately.

20 Claims, 9 Drawing Sheets

Z-STAGE CONFIGURATION AND APPLICATION THEREOF

BACKGROUND OF THE INVENTION

1. Field of the Invention

The present invention relates to a z-stage configuration and application thereof, and more especially, to a z-stage configuration for a scanning electron microscope (SEM) machine, a system for detecting a surface movement of a specimen on the z-stage, and a system for offsetting the SEM vibration.

2. Background of the Related Art

In a SEM machine, a stage is used to carry a specimen for imaging or inspection. The stage includes an x-y stage, a z stage on the x-y stage and an E-chuck structure on the z stage, wherein the x-y stage is used to adjust the lateral position of the specimen, and the z-stage is used to adjust the height of the specimen for focus of an E-beam, the topography of the specimen, or the declined x-y stage.

FIG. 1 illustrates a cross-sectional view of the conventional z-stage structure and the structural relationship to the E-chuck structure. As shown in FIG. 1, the z-stage structure 10 includes a first metal plate 12, a second metal plate 14 and a third metal plate 16. A plurality of C-shape flex clamps 18 clamping a piezo actuator 181 are respectively configured on the four corners of the first metal plate 12 and against the second metal plate 14. A plurality of ceramic stands 20 between the second metal plate 14 and the third metal plate 16 are used to support the third metal plate 16 and electrically isolate the second metal plate 14 from the third metal plate 16, to which a high electrical voltage is applied. The E-chuck structure 22 is placed on the third metal plate 16 where the specimen (not shown) is attached to, and an EM shielding 24 supported by a plurality of stands 26 on the third metal plate 16 is around the E-chuck structure 22.

Further, referring to FIG. 1 and FIG. 2 simultaneously, a plurality of the optical mirror stands 28 are fastened on the two sides of the second metal plate 14. Two mirrors 30 are supported by the optical mirror stands 28 by means of glue or mechanical fastening and joining, and arranged on the two sides of the second metal plate 14. Two Laser interferometers 32 are arranged respectively near the two mirrors 30 to detect the vertical movement of the second metal plate 14 and then to send signals to a controller 34, such that an E-beam column 36 may receive a real-time location of the specimen.

However, the location of the optical mirror 30 and E-chuck structure 22 may have vibration deviation due to high frequency (about 200 Hz) of movement. The vibration deviation may cause the z-stage structure 10 to decline and signals detected by the Laser interferometer 32 to contain errors.

SUMMARY OF THE INVENTION

In order to solve the foregoing problems, one object of this invention is to provide a z-stage, wherein a ceramic plate is used as the body of the z-stage to replace both the second metal plate and third metal plate of the conventional configuration. Because the number of metal plates used is reduced, the z-stage has a more compact structure, which may decrease the vibrational movement of the z-stage, and hence the vibration deviations of the z-stage.

One object of this invention is to provide a detecting system used to detect the vibration of the z-stage, so that the horizontal movement of the specimen surface caused by the vibrational movement may be detected more accurately.

One object of this invention is to provide a system used to detect the vibration of the E-beam column so that the signals detected by the E-beam column are more accurate.

One object of this invention is to provide a method for offsetting SEM vibration to offset the surface movement of the specimen.

Accordingly, one embodiment of the present invention provides a z-stage configuration for a SEM machine including: a metal plate; a ceramic plate over the metal plate; and at least three C-shape flex clamps on a peripheral region of the metal plate for supporting the ceramic plate, wherein each clamp has a piezo actuator; and two mirrors fastened to two sides of the ceramic plate, wherein the two sides are perpendicular.

Another embodiment of the present invention provides a stage configuration for adjusting specimen height in a SEM machine, including: a metal plate; a ceramic plate over the metal plate; four C-shape flex clamps on corners of the metal plate for supporting the ceramic plate, wherein each clamp has a peizo actuator; an E-chuck configuration on a surface of the ceramic plate for fastening a specimen; an EM shielding plate with an opening to expose the E-chuck configuration; a plurality of stands around the ceramic plate for supporting the EM shielding plate; and two reflective materials on sidewalls of the ceramic plate.

Another embodiment of the present invention provides a system for detecting a surface movement of a specimen on a z-stage in an inspection machine, including: a first Laser interferometer for detecting a first point on a sidewall of the z-stage; a second Laser interferometer for detecting a second point on the sidewall of the z-stage, wherein the second point and the first point are along a vertical line of the sidewall of the z-stage; and means for calculating the surface movement of the specimen according to a detected movement of the first and second points, and a location of the first and second points as well as the specimen.

Another embodiment of the present invention provides a system for offsetting SEM vibration, including: a first Laser interferometer for detecting a first point on a sidewall of a z-stage; a second Laser interferometer for detecting a second point on the sidewall of the z-stage, wherein the second point and the first point are along a vertical line of the sidewall of the z-stage; first means for calculating a surface movement of a specimen according to detected movements of the first and second points, and locations of the first and second points as well as specimen; a third Laser interferometer for detecting a third point on a sidewall of an E-beam column; and second means for calculating a movement of the E-beam column to offset the surface movement of the specimen.

Another embodiment of the present invention provides a method for offsetting SEM vibration, including: detecting a first point on a sidewall of a z-stage by a first Laser interferometer; detecting a second point on the sidewall of the z-stage by a second Laser interferometer, wherein the second point and the first point are along a vertical line of the sidewall of the z-stage; calculating a surface movement of a specimen according to detected movements of the first and second points, and locations of the first and second points as well as the specimen; detecting a third point on the sidewall of an E-beam column by a third Laser interferometer; and calculating a movement of the E-beam column to offset the surface movement of the specimen.

Another embodiment of the present invention provides a system for offsetting an E-beam column movement, including: a Laser interferometer for detecting a point on a sidewall of the E-beam column; and means for calculating the movement of the E-beam column to offset a surface movement of a specimen to be inspected by the E-beam column.

DETAILED DESCRIPTION OF THE INVENTION

Figure 1:
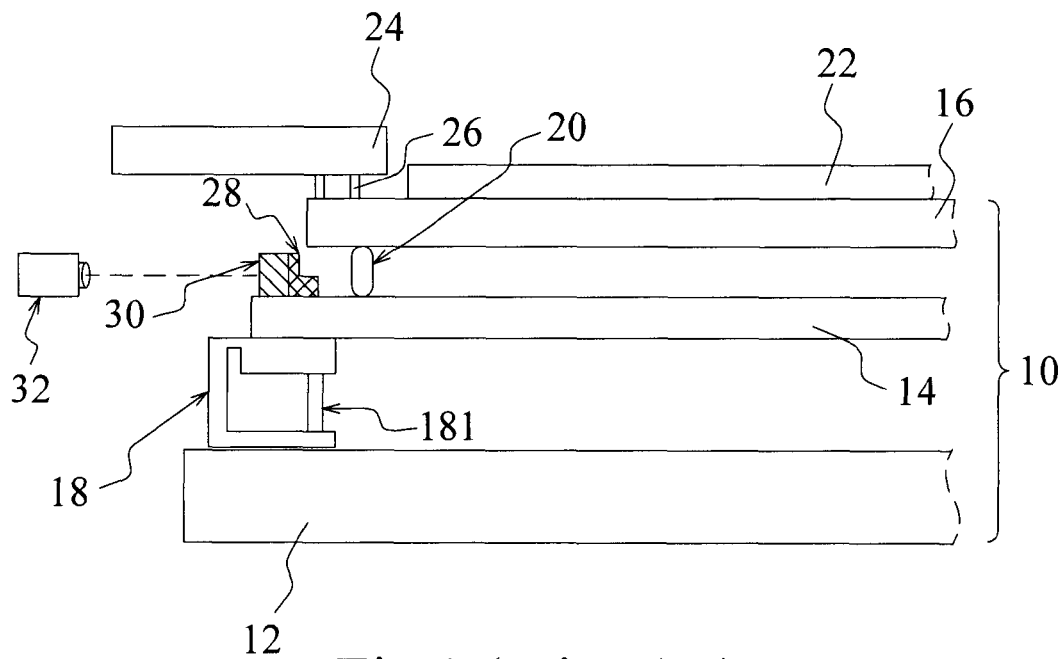
FIG. 1 illustrates a cross-sectional view of the conventional z-stage structure and its structural relationship to the E-chuck structure.
Figure 2:
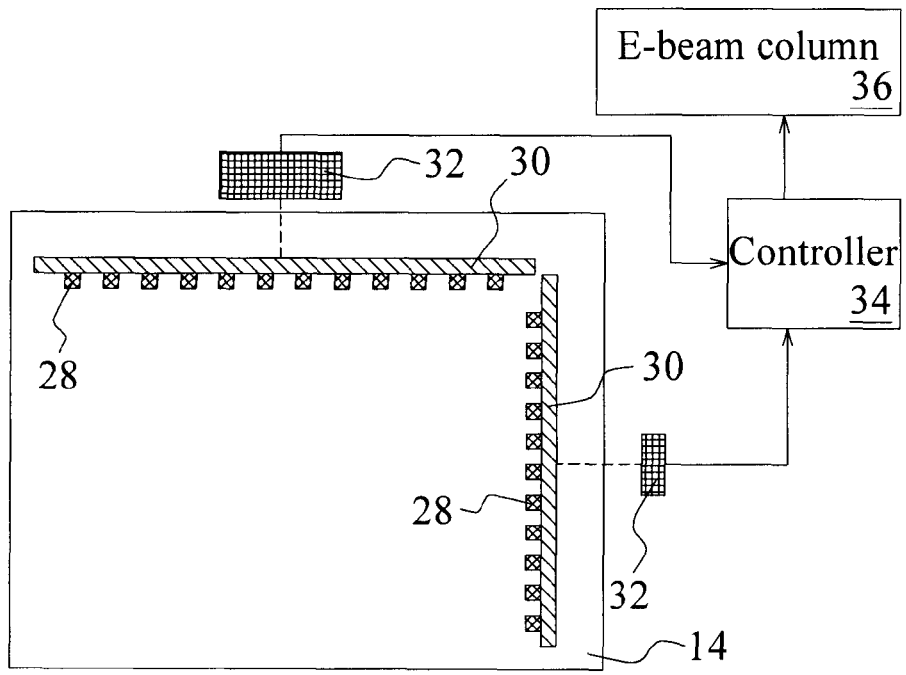
FIG. 2 illustrates a top view of the second metal plate, the optical mirror stands, the mirrors and the Laser interferometers.
Figure 3:
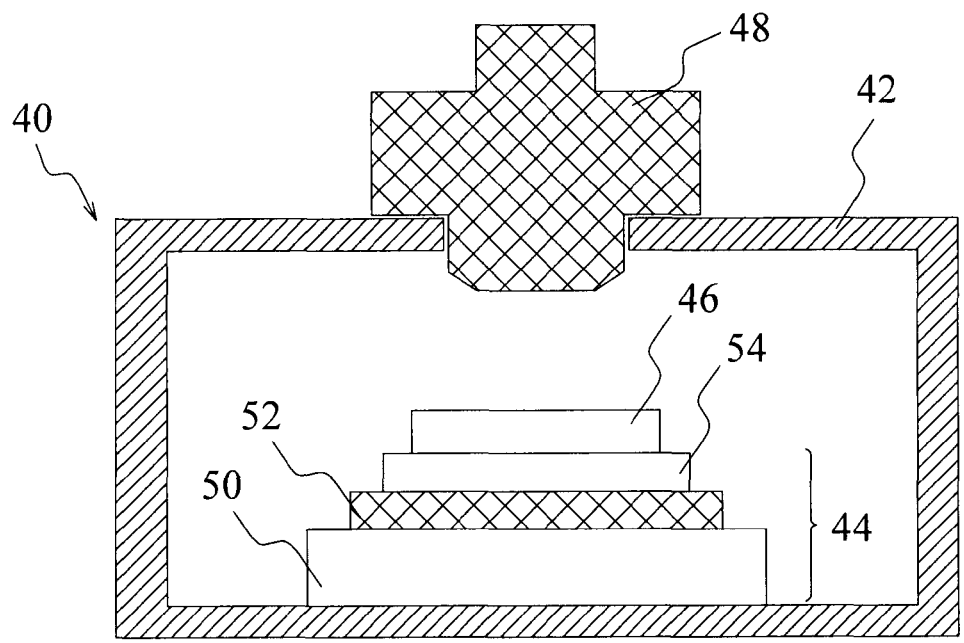
FIG. 3 illustrates a cross-sectional view of a configuration of an image chamber of a charged particle beam imaging system.

FIG. 3 illustrates a cross-sectional view of a configuration of an image chamber of a charged particle beam imaging system. The image chamber 40 includes a chamber 42, a stage 44 for carrying a specimen 46 set within the chamber 42, and an e-beam column 48 mounted on the top cover of the chamber 42 for imaging the specimen 46. In general, the stage 44 includes an x-y stage 50, a z stage 52 on the x-y stage 50, and an E-chuck structure 54 on the z stage 52, wherein the E-chuck structure 54 is where the specimen 46 is attached to, the x-y stage 50 is used to adjust the lateral position of the specimen 46, and the z-stage 52 is used to adjust the height of the specimen 46 for focus of an E-beam, the topography of the specimen 46, or the declined x-y stage 50.

Figure 4:
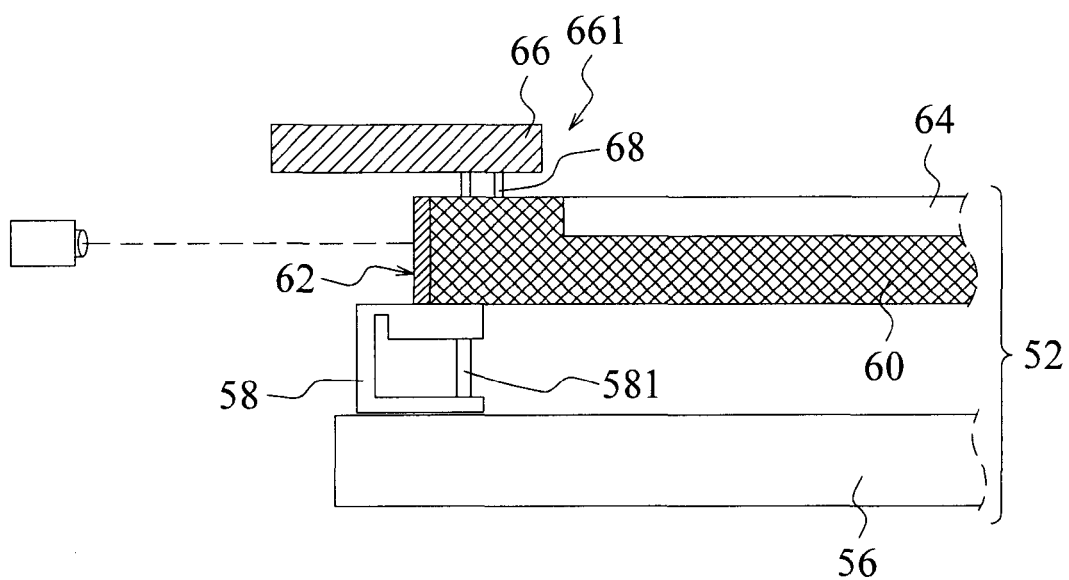
FIG. 4 illustrates a cross-sectional view of a portion of a stage in accordance with a first embodiment of the present invention.
Figure 5:
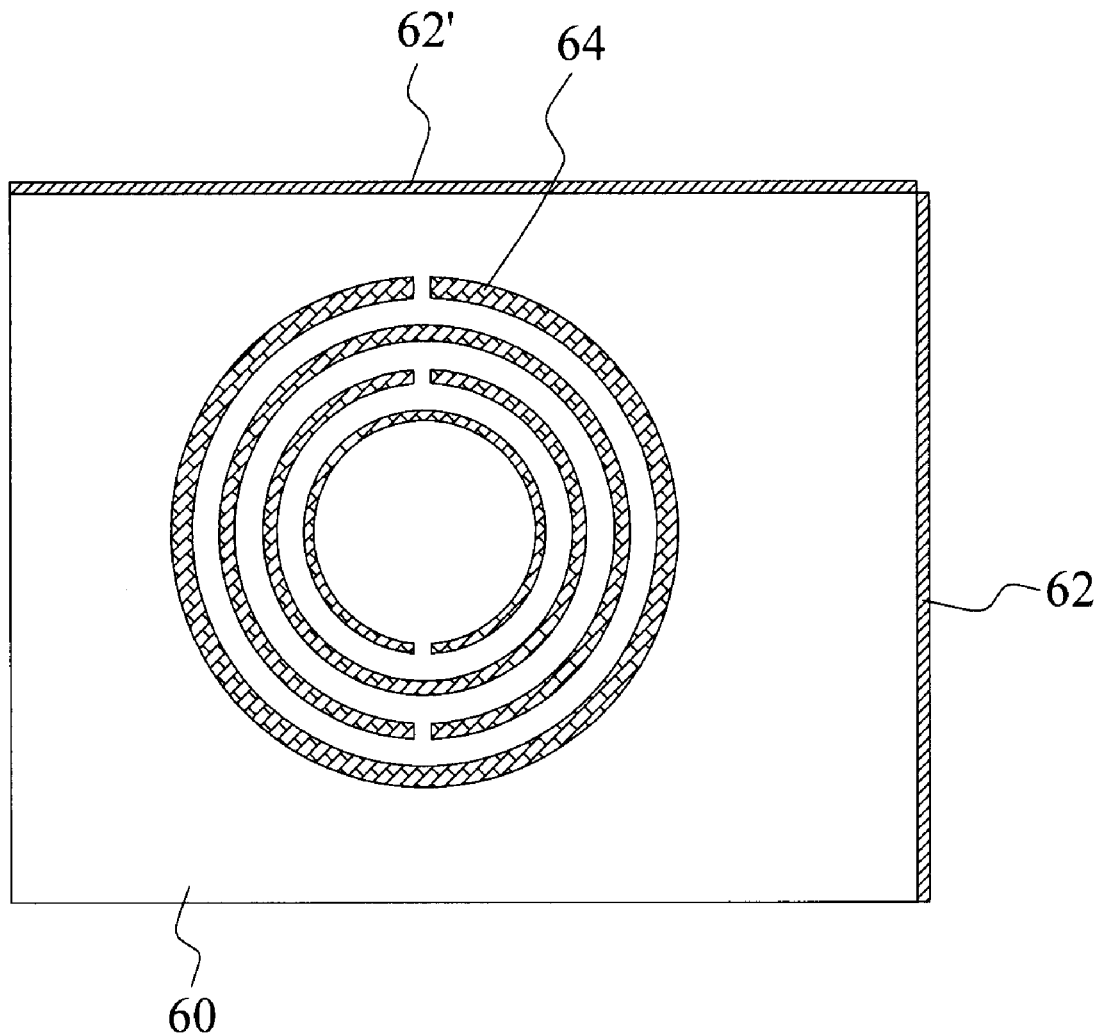
FIG. 5 illustrates a top view of the ceramic plate, the E-chuck electrode and the mirrors in accordance with the first embodiment of the present invention.

FIG. 4 illustrates a cross-sectional view of a portion of a stage configuration in accordance with a first embodiment of the present invention, wherein only a portion of a z-stage 52, a portion of an E-chuck structure (denoted as 54 in FIG. 3), and a portion of an EM shielding 66 are illustrated. The z-stage 52 includes a metal plate 56, a plurality of C-shape flex clamps 58 (FIG. 4 only illustrates one C-shape flex clamps), a ceramic plate 60 and two reflective materials. In one embodiment, the two reflective materials are two reflective mirrors 62, 62' (FIG. 4 only illustrates the reflective mirror 62), such as two glasses. The plurality of C-shape flex clamps 58 are arranged on the peripheral region of the metal plate 56 for supporting the ceramic plate 60 over the metal plate 56, wherein each C-shape flex clamp 58 has a piezo actuator 581 to control the height of the ceramic plate 60. The two reflective mirrors 62, 62' are respectively fastened on the two sides of the ceramic plate 60, as shown in FIG. 5, wherein the two sides, the two reflective mirrors 62, 62' accordingly, are not parallel, preferred perpendicular. In one embodiment, the metal plate 56 is square or polygon and is made of aluminum (Al) or other metal materials. The E-chuck structure 54 herein is an E-chuck electrode 64 including a plurality of electric circuits embedded on the surface of the ceramic plate 60. The configuration of the E-chuck electrode 64 may present different shapes to correspond to different specimens 46 (shown in FIG. 3). For example, if the specimen 46 is a wafer, the E-chuck electrode 64 may be circular to provide a good contact with the wafer; and if the specimen 46 is a mask, the E-chuck electrode 64 may be square to provide a good contact with the mask. As shown in FIG. 4, the EM shielding plate 66 is above the ceramic plate 60 and supported by a plurality of stands 68 around the ceramic plate 60, wherein the EM shielding plate 66 has an opening 661 to expose the E-chuck electrode 64.

Figure 6:
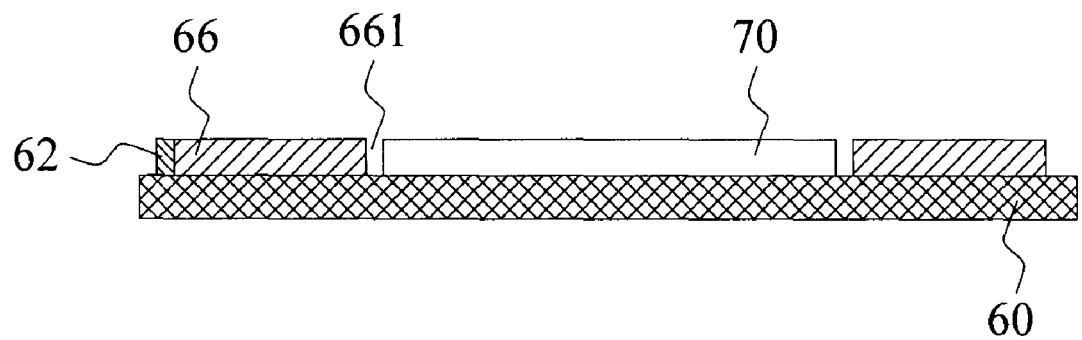
FIG. 6 illustrates a cross-sectional view of a configuration of the ceramic plate, E-chuck structure, reflective mirror and the EM shielding plate in accordance with a second embodiment of the present invention.
Figure 7:
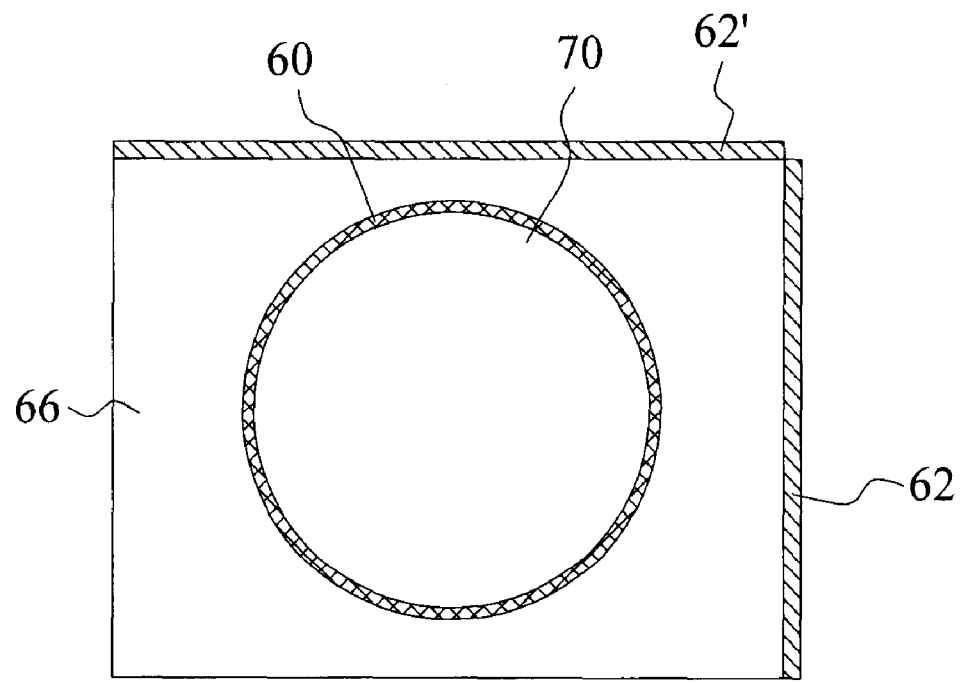
FIG. 7 illustrates a top view of the ceramic plate, E-chuck structure, reflective mirrors and the EM shielding plate in accordance with the second embodiment of the present invention.

FIG. 6 illustrates a cross-sectional view of a configuration of the ceramic plate, E-chuck structure, reflective mirror and the EM shielding plate in accordance with a second embodiment of the present invention. Different from the first embodiment, the E-chuck structure is an E-chuck plate 70 fastened on the top surface of the ceramic plate 60, instead of the E-chuck electrode 64 embedded on the ceramic plate 60 as shown in FIG. 5. Referring to FIG. 6 and FIG. 7, the E-chuck plate 70 is disc-shaped, and the EM shielding plate 66 having an opening 661 is configured surrounding the E-chuck plate 70 on the top surface of the ceramic plate 60. In one embodiment, the material of the EM shielding plate 66 can be aluminum or other non-magnetic metal materials, so that two reflective mirrors 62, 62' can be respectively formed with the two perpendicular sidewalls of the EM shielding plate 66 by polishing the sidewalls of the EM shielding plate 66.

Figure 8:
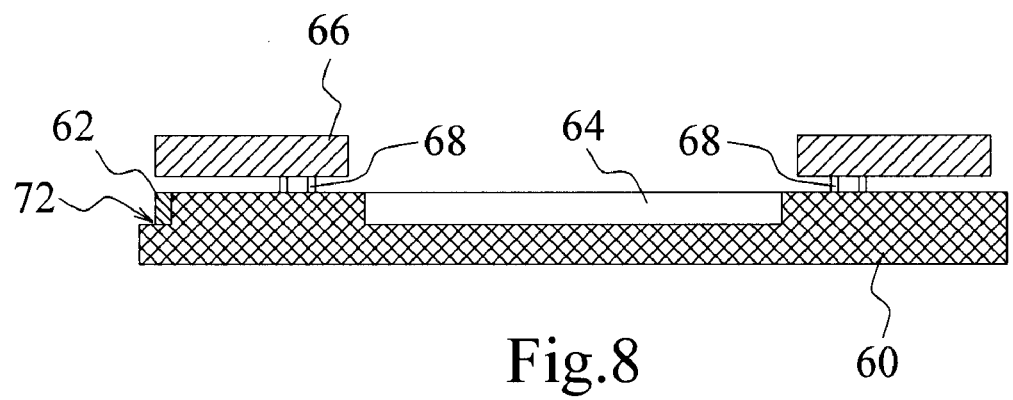
FIG. 8 illustrates a cross-sectional view of a configuration of the ceramic plate, E-chuck structure, reflective mirror and the EM shielding plate in accordance with a third embodiment of the present invention.
Figure 9:
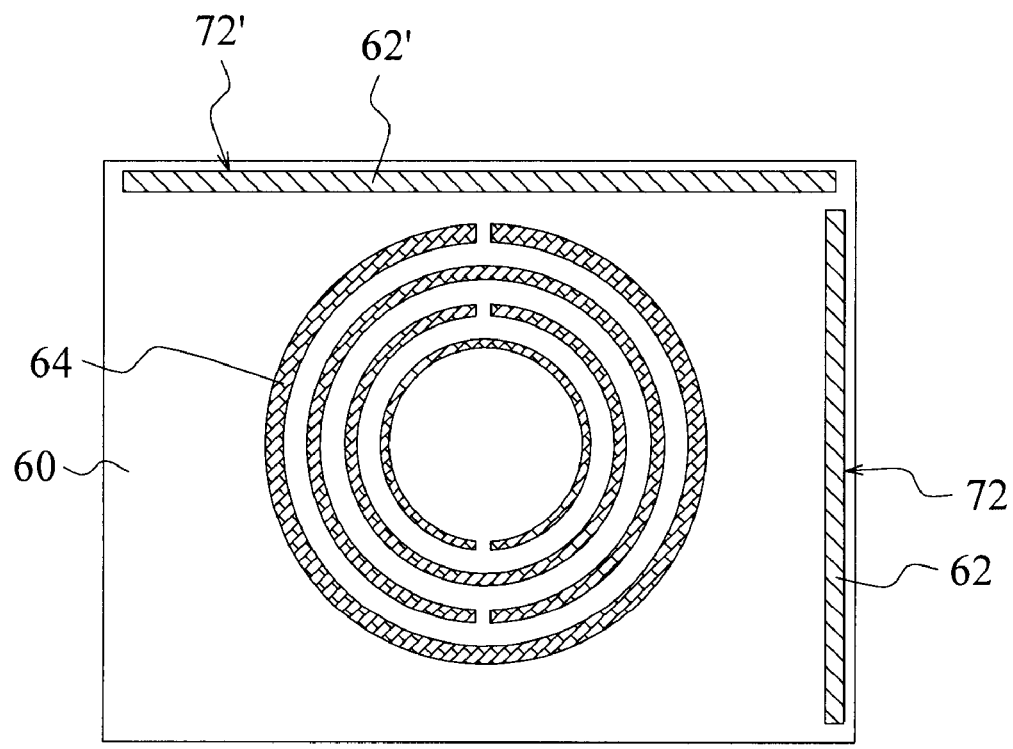
FIG. 9 illustrates a top view of the ceramic plate, E-chuck structure and reflective mirrors in accordance with the third embodiment of the present invention.

FIG. 8 illustrates a cross-sectional view of a configuration of the ceramic plate, E-chuck structure, reflective mirror and the EM shielding plate in accordance with a third embodiment of the present invention. FIG. 9 illustrates a top view of the ceramic plate, E-chuck structure and reflective mirrors in accordance with a third embodiment of the present invention. As shown in FIG. 8 and FIG. 9, different from the first embodiment, two perpendicular sides of the ceramic plate 60 respectively have a step structure 72 and a step structure 72' that are adjacent to one corner of the ceramic plate 60, so that two reflective mirrors 62, 62', such as two glasses, may be configured with the step structures 72, 72'. The E-chuck structure is an E-chuck electrode 64 embedded on the surface of the ceramic plate 60, and the EM shielding plate 66 is supported by a plurality of stands 68 around and above the ceramic plate 60.

Figure 10:
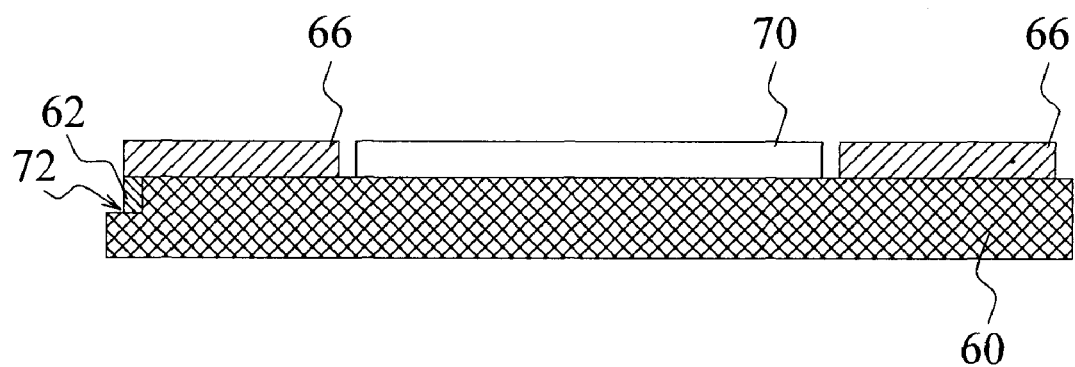
FIG. 10 illustrates a cross-sectional view of a configuration of the ceramic plate, E-chuck structure, reflective mirror and the EM shielding plate in accordance with a fourth embodiment of the present invention.
Figure 11:
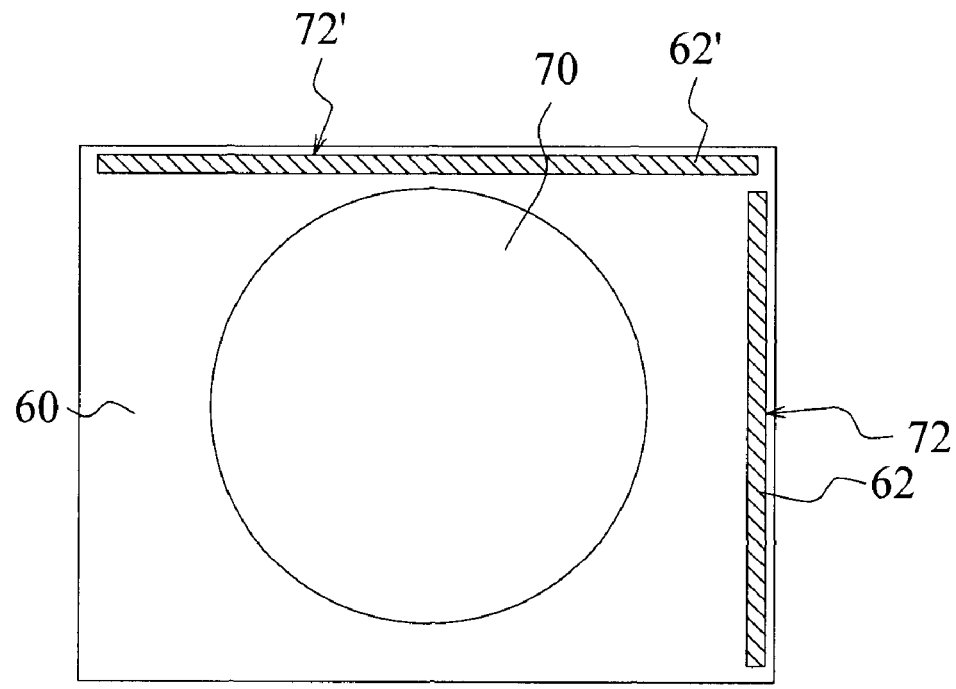
FIG. 11 illustrates a top view of the ceramic plate, E-chuck structure and reflective mirrors in accordance with the fourth embodiment of the present invention.

FIG. 10 illustrates a cross-sectional view of a configuration of the ceramic plate, E-chuck structure, reflective mirror and the EM shielding plate in accordance with the fourth embodiment of the present invention. FIG. 11 illustrates a top view of the ceramic plate, E-chuck structure and reflective mirrors in accordance with a fourth embodiment of the present invention. As shown in FIG. 10 and FIG. 11, the same as the third embodiment, there are two step structures 72, 72' respectively formed on the two perpendicular sides of the ceramic plate 60, so that the two reflective mirrors 62, 62', such as two glasses, may be configured with the step structures 72, 72'. But in the fourth embodiment, the E-chuck structure is an E-chuck plate 70 fastened on the top surface of the ceramic plate 60, instead of the E-chuck electrode 64 embedded on the ceramic plate 60, as shown in FIG. 9. The EM shielding plate 66 is configured on the ceramic plate 60 and around the E-chuck plate 70.

In the foregoing embodiments, the ceramic plate 60 is used as a body of the z-stage 52 to replace both the second metal plate 14 and the third metal plate 16 of the conventional configuration. Replacing the metal plates 14, 16 with a ceramic plate 60 produces a compact structure of the z-stage 52 that may decrease the vibrational movement of the z-stage 52, and hence the vibration deviations of the z-stage 52.

It is noted that the z-stage configuration may be applied not only the foregoing SEM technology, but also the equipment with the z-stage, such as the optical image system, or stepper.

Because the horizontal movement of the x-y stage 50 is of a high frequency at about 200 Hz, the horizontal movement may cause the z-stage 52 to decline and further affect the position of the specimen 46. For detecting the surface movement of the specimen 46 on the z-stage 52, a detecting system in a charged particle beam imaging/inspection system is provided.

Figure 12:
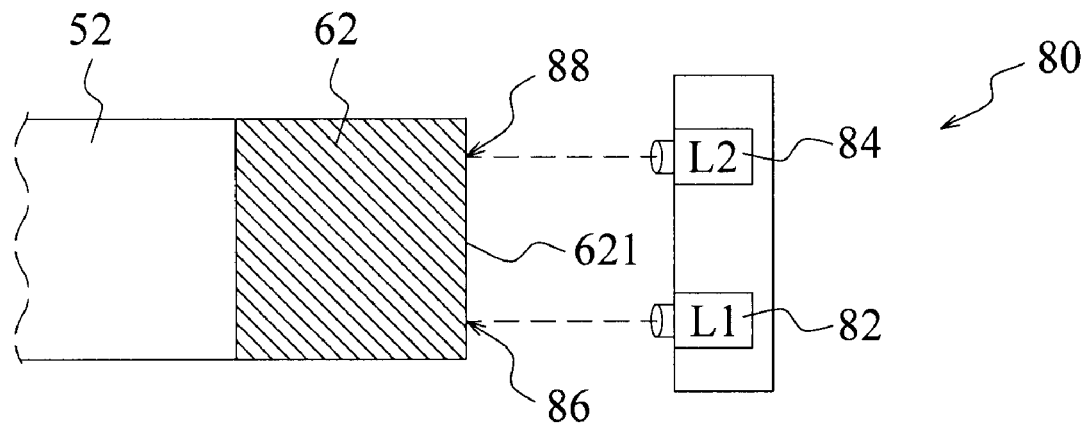
FIG. 12 illustrates a cross-sectional view of a detecting system used to detect the vibration of the z-stage in accordance with an embodiment of the present invention.

FIG. 12 illustrates a cross-sectional view of a detecting system used to detect the vibration of the z-stage in accordance with an embodiment of the present invention. As shown in FIG. 12, the detecting system 80 includes a first Laser interferometer 82 and a second Laser interferometer 84. The first Laser interferometer 82 is used to detect a first point 86 on a sidewall of the z-stage 52, and the second Laser interferometer 84 is used to detect a second point 88 on the sidewall of the z-stage 52, wherein the second point 88 and the first point 86 are along a vertical line of the sidewall of the z-stage 52. It is noted that the sidewall of the z-stage 52 herein means, for example, the reflective mirror 62 arranged on one side of the z-stage 52. The reflective mirror 62 reflects the optical beams emitted from the first Laser interferometer 82 and the second Laser interferometer 84 back to the first Laser interferometer 82 and the second Laser interferometer 84, respectively, so that the first Laser interferometer 82 and the second Laser interferometer 84 may respectively detect the movements of the first point 86 and the second point 88 along a vertical line.

Figure 13:
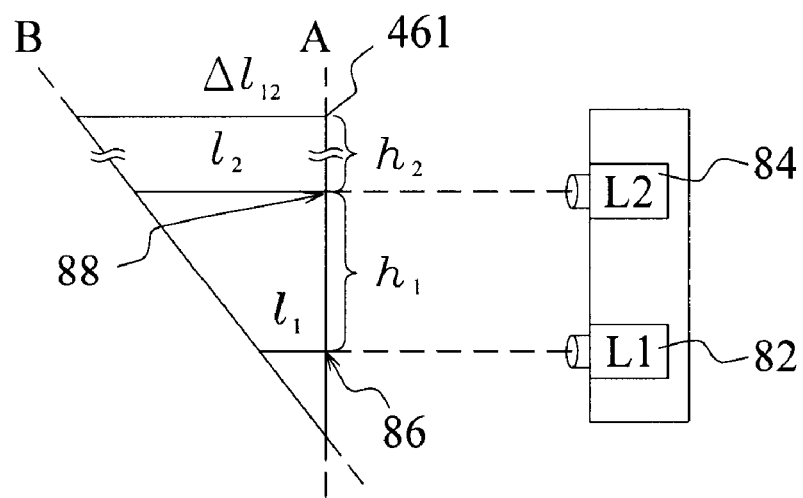
FIG. 13 illustrates a configuration for calculating the movement of the specimen's surface by using the two Laser interferometers in accordance with an embodiment of the present invention.

FIG. 13 illustrates a configuration for calculating the movement of the specimen's surface by using the two Laser interferometers in accordance with an embodiment of the present invention. Line A represents the first position of the reflective mirror edge 621 shown in FIG. 12, and the first point 86 and the second point 88 thereon correspond respectively to where the beam of the first Laser interferometer 82 and the beam of the second Laser interferometer 84 are pointed at. Assuming that the distance from the first point 86 to the second point 88 on line A is $h_1$, and the distance from the second point 88 to the specimen surface 461 along line A is $h_2$, wherein $h_1$ and $h_2$ are predetermined. When the specimen surface 461 declines due to the vibrational movement of the z-stage 52, as shown in FIG. 13, the reflective mirror edge 621 is then represented by line B. On the same detecting path, the first Laser interferometer 82 may detect the movement ($l_1$) of the first point from line A to line B, and the second interferometer 84 may detect the movement ($l_2$) of the second point form line A to line B. According to $h_1$, $h_2$, $l_1$ and $l_1$, we can calculate the movement ($\Delta l_{1,2}$) of the specimen surface 461.

In this embodiment, the movement of the specimen surface 461 along a direction may be calculated by arranging two Laser interferometers 82, 84 to detect the movement of one reflective mirror 62, the first reflective mirror accordingly, configured on one side of the z-stage 52. The movement of the specimen surface 461 along another direction may be calculated by arranging another two Laser interferometers to detect the movement of the second reflective mirror, which is perpendicular to the first reflective mirror and is configured on another side of the z-stage. By using two Laser interferometers, the horizontal movement of the specimen surface can be detected more accurately, and hence, the position of the E-beam can be adjusted correspondingly to the vibrational movement of the specimen.

Besides the vibrational movement of the z-stage, the distortion imaging of the specimen surface may be caused by the SEM vibration. The SEM vibration may come from the vibration of the chamber or the vibration of the e-beam column.

Figure 14:
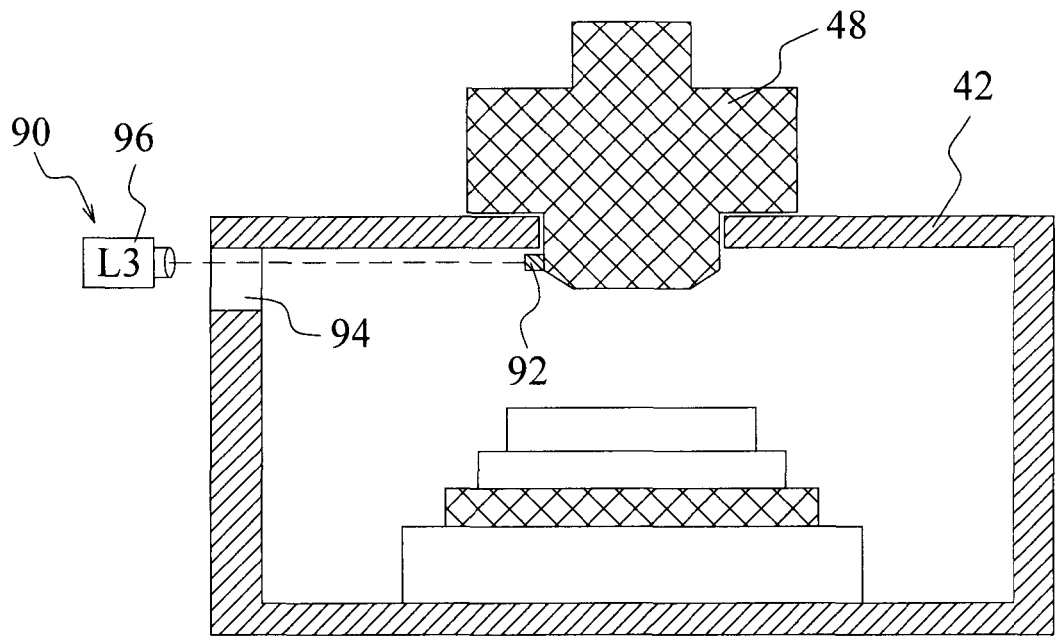
FIG. 14 illustrates a cross-sectional view of a system used to detect the vibration of the E-beam column for offsetting an E-beam column movement in accordance with an embodiment of the present invention.

FIG. 14 illustrates a cross-sectional view of a system used to detect the vibration of the E-beam column so as to offset an E-beam column movement in accordance with an embodiment of the present invention. As shown in FIG. 14, the system 90 includes a third reflective mirror 92 configured on the sidewall of the E-beam column 48, and a window 94 formed on the side of the chamber 42. A third Laser interferometer 96 is arranged outside the chamber 42 and corresponds to the third reflective mirror 92 through the window 94. The third reflective mirror 92 may reflect the optical beams emitted from the third Laser interferometer 96 back to the third Laser interferometer 96, so that the movement of the E-beam column 48 can be calculated. To sum up, the system 90 for offsetting an E-beam column movement include a reflective mirror 92, the third Laser interferometer 96 accordingly, for detecting a point on the sidewall of the E-beam column 48; and means for calculating the movement of the E-beam column 48 to offset the movement of the specimen surface to be inspected by the E-beam column 48.

Figure 15:
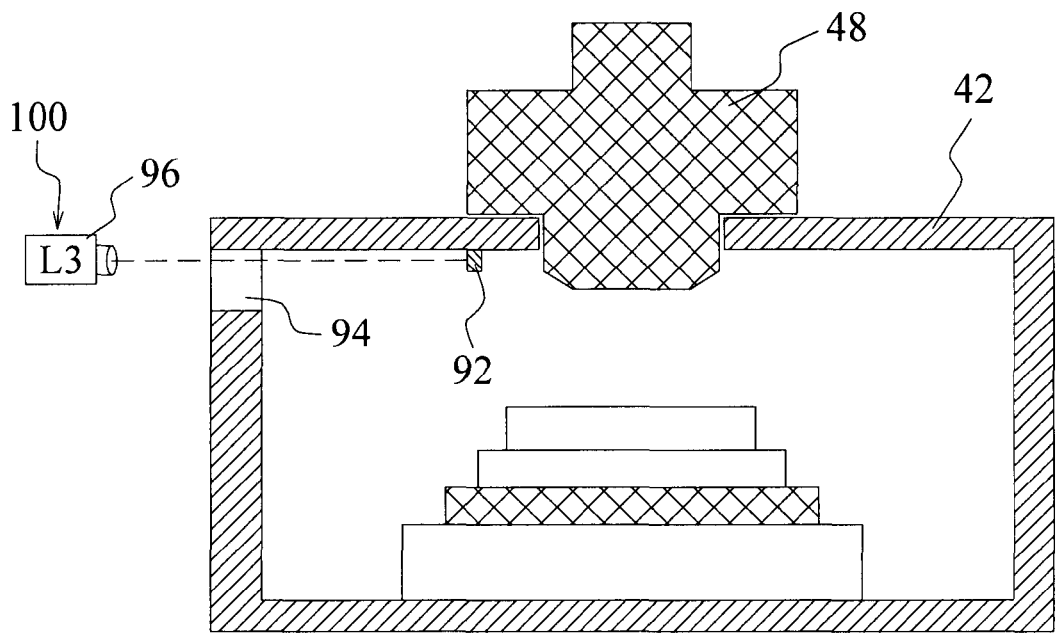
FIG. 15 illustrates a cross-sectional view of a system used to detect the vibration of the chamber in accordance with an embodiment of the present invention.

FIG. 15 illustrates a cross-sectional view of a system used to detect the vibration of the chamber in accordance with an embodiment of the present invention. As shown in FIG. 15, the system 100 includes a third reflective mirror 92 configured on the top cover of the chamber 42, and a window 94 formed on the side of the chamber 42. A third Laser interferometer 96 is arranged outside the chamber 42 and corresponds to the third reflective mirror 92 through the window 94. The third reflective mirror 92 may reflect the optical beams emitted from the third Laser interferometer 96 back to the third Laser interferometer 96, so that the movement of the chamber 42 can be calculated. In general, because the E-beam column 48 is mounted on the top cover of the chamber 42, the movement of the chamber 42 may correspond to the movement of the E-beam column 48.

Therefore, a system for offsetting SEM vibration includes the foregoing detecting system 80 used to detect the vibration of the z-stage 52, and the system 90 used to detect the vibration of the E-beam column 48.

Figure 16:
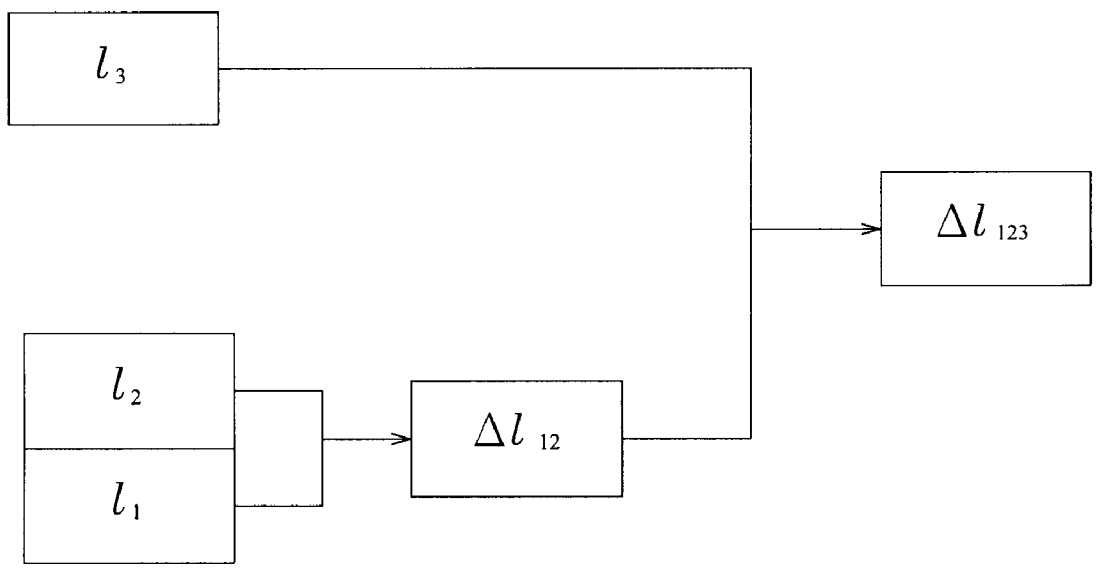
FIG. 16 illustrates a configuration for calculating the total offset value to offset the movement of the specimen surface in accordance with an embodiment of the present invention.

FIG. 16 illustrates a configuration for calculating the total offset value to offset the surface movement of the specimen in accordance with an embodiment of the present invention. Referring to FIG. 12, FIG. 13 and FIG. 16, the method for offsetting SEM vibration includes detecting a first point 86 on a sidewall of a z-stage 52 by a first Laser interferometer 82; detecting a second point 88 on the sidewall of the z-stage 52 by a second Laser interferometer 84, wherein the second point 84 and the first point 82 are along a vertical line of the sidewall of the z-stage 52; calculating the movement ($\Delta l_{12}$) of a specimen surface 461 according to detected movements ($l_1$, $l_2$) of the first and second points 82, 84, and locations of the first and second points 82, 84 as well as the specimen surface 461; detecting a third point on the sidewall of an E-beam column 48 by a third Laser interferometer 96; and calculating the movement ($l_3$) of the E-beam column 48 to offset the movement ($\Delta l_{123}$) of the specimen surface 461.

To sum up, two Laser interferometers are used to detect movements of different points along a vertical line of the sidewall of the z-stage to calculate the surface movement of the specimen, so that the horizontal movement of the specimen surface can be detected more accurately. Furthermore, a third Laser interferometer may also be used to detect the movement of the E-beam column to correct the surface movement of the specimen, so that the signals detected by the E-beam column are more accurate.

Although the present invention has been explained in relation to its preferred embodiment, it is to be understood that other modifications and variation can be made without departing the spirit and scope of the invention as hereafter claimed.

What is claimed is:

1. A z-stage configuration, comprising:
   a metal plate;
   a ceramic plate over said metal plate;
   at least three C-shape flex clamps on a peripheral region of said metal plate for supporting said ceramic plate, wherein each clamp has a piezo actuator; and
   two mirrors fastened to two sides of said ceramic plate, wherein said two sides are perpendicular.

2. The z-stage configuration according to claim 1, wherein said ceramic plate has two step structures adjacent to one corner of said ceramic plate, and said two mirrors are fastened to said two step structures.

3. A stage configuration for adjusting specimen height in a SEM machine, comprising:
   a metal plate;
   a ceramic plate over said metal plate;
   four C-shape flex clamps on corners of said metal plate for supporting said ceramic plate, wherein each clamp has a peizo actuator;
   an E-chuck configuration on a surface of said ceramic plate for fastening a specimen;
   an EM shielding plate with an opening to expose said E-chuck configuration;
   a plurality of stands around said ceramic plate for supporting said EM shielding plate; and
   two reflective materials on sidewalls of said ceramic plate.

4. The stage configuration according to claim 3, wherein said metal plate is a Al metal plate.

5. The stage configuration according to claim 3, wherein said metal plate is square or polygon.

6. The stage configuration according to claim 3, said specimen is a wafer or a mask.

7. The stage configuration according to claim 3, wherein said E-chuck configuration is electric circuits embedded on a surface of said ceramic plate.

8. The stage configuration according to claim 3, wherein said E-chuck configuration is an E-chuck plate.

9. The stage configuration according to claim 3, wherein said two reflective materials are formed by polishing said ceramic plate and coating a reflective material thereon.

10. The stage configuration according to claim 3, wherein said ceramic plate has two step structures adjacent to one corner of said ceramic plate.

11. The stage configuration according to claim 10, wherein said two reflective materials are two mirrors fastened to said two step structures.

12. The stage configuration according to claim 11, wherein said E-chuck configuration is electric circuits embedded on a surface of said ceramic plate.

13. The stage configuration according to claim 11, wherein said E-chuck configuration is an E-chuck plate.

14. The stage configuration according claim 3, further including multiple Laser interferometers for detecting vibration movement of said z-stage.

15. A system for detecting surface movement of a specimen on a z-stage, comprising:
   a first Laser interferometer for detecting a first point on a sidewall of said z-stage;
   a second Laser interferometer for detecting a second point on said sidewall of said z-stage, wherein said second point and said first point are along a vertical line of said sidewall of said z-stage; and
   means for calculating a surface movement of said specimen according to detected movements of said first and second points, and locations of said first and second points as well as said specimen.

16. A system for offsetting SEM vibration, comprising:
   a first Laser interferometer for detecting a first point on a sidewall of a z-stage;
   a second Laser interferometer for detecting a second point on said sidewall of said z-stage, wherein said second point and said first point are along a vertical line of said sidewall of said z-stage;
   first means for calculating a surface movement of a specimen according to detected movements of said first and second points, and locations of said first and second points as well as said specimen;
   a third Laser interferometer for detecting a third point on a sidewall of an E-beam column; and
   second means for calculating a movement of said E-beam column to offset said surface movement of said specimen.

17. The system according to claim 16, further comprising a reflective mirror fastened to said E-beam column for said third Laser interferometer detection.

18. The system according to claim 16, further comprising a reflective mirror fastened to a top cover of a chamber for said third Laser interferometer detection, wherein said E-beam column is mounted to said top cover.

19. A method for offsetting SEM vibration, comprising:
   detecting a first point on a sidewall of a z-stage by a first Laser interferometer;
   detecting a second point on said sidewall of said z-stage by a second Laser interferometer, wherein said second point and said first point are along a vertical line of said sidewall of said z-stage;

calculating a surface movement of a specimen according to detected movements of said first and second points, and locations of said first and second points as well as said specimen;

detecting a third point on a sidewall of an E-beam column by a third Laser interferometer; and calculating a movement of said E-beam column to offset said surface movement of said specimen.

20. A system for offsetting an E-beam column movement, comprising:

a Laser interferometer for detecting a point on a sidewall of said E-beam column; and means for calculating a movement of said E-beam column to offset a surface movement of a specimen to be inspected by said E-beam column.

* * * * *